(12) United States Patent
Murukesan et al.

(10) Patent No.: US 11,661,849 B2
(45) Date of Patent: May 30, 2023

(54) TURBOCHARGER TURBINE WHEELS HAVING AN ALPHA-ALUMINA COATING AND METHODS FOR MANUFACTURING THE SAME

(71) Applicant: Garrett Transportation I Inc, Torrance, CA (US)

(72) Inventors: Palaniappa Murukesan, Bangalore (IN); Philippe Renaud, Sanchey (FR)

(73) Assignee: Garrett Transportation I Inc., Torrance, CA (US)

( * ) Notice: Subject to any disclaimer, the term of this patent is extended or adjusted under 35 U.S.C. 154(b) by 143 days.

(21) Appl. No.: 17/248,894

(22) Filed: Feb. 12, 2021

(65) Prior Publication Data

US 2022/0259976 A1 Aug. 18, 2022

(51) Int. Cl.
*F01D 5/04* (2006.01)
*C23C 14/04* (2006.01)
(Continued)

(52) U.S. Cl.
CPC ............ *F01D 5/043* (2013.01); *C23C 14/042* (2013.01); *C23C 14/081* (2013.01); *C23C 14/34* (2013.01);
(Continued)

(58) Field of Classification Search
CPC ....... F01D 5/043; F01D 5/288; C23C 14/042; C23C 14/081; C23C 14/34;
(Continued)

(56) References Cited

U.S. PATENT DOCUMENTS 5,683,761 A 11/1997 Bruce et al.
9,186,758 B2 11/2015 Henker et al.
(Continued)

FOREIGN PATENT DOCUMENTS

CN 111020479 A 4/2020
DE 202009016174 U1 3/2010
(Continued)

OTHER PUBLICATIONS

Zhu Shenglong et al, Surface and Coatings Technology, Reactive Sputter Deposition of Alumina Films on Superalloys and Their High Temperature Corrosion Resistance, Feb. 1, 1995, pp. 9-15, vol. 71, No. 1.

*Primary Examiner* — Loren C Edwards
*Assistant Examiner* — Edward Bushard
(74) *Attorney, Agent, or Firm* — Quinn IP Law

(57) ABSTRACT

An alpha-alumina coated turbocharger turbine wheel includes a hub portion, a plurality of blades disposed about the hub portion, each blade of the plurality of blades having a leading edge and a trailing edge, a centerline passing axially through the hub portion, and a back-side wall defined radially between the leading edge of each blade of the plurality of blades and the centerline. The turbocharger turbine wheel is made of a metal alloy and a surface coating layer of alpha-alumina. The surface coating layer of alpha-alumina may be disposed only on the hub portion, the plurality of blades, and a radially-outer portion of the back-side wall. The radially-outer portion is defined between a radial distance from the centerline and the leading edge of each blade of the plurality of blades. Alternatively, the surface coating layer of alpha-alumina may be disposed on the hub portion, the plurality of blades, and an entirety of the back-side wall.

20 Claims, 9 Drawing Sheets

(51) Int. Cl.
  *C23C 14/08* (2006.01)
  *C23C 14/34* (2006.01)
  *C23C 14/58* (2006.01)

(52) U.S. Cl.
  CPC ........ *C23C 14/588* (2013.01); *C23C 14/5846* (2013.01); *F05D 2220/40* (2013.01); *F05D 2230/313* (2013.01); *F05D 2230/90* (2013.01); *F05D 2240/20* (2013.01); *F05D 2300/175* (2013.01)

(58) Field of Classification Search
  CPC . C23C 14/5846; C23C 14/588; C23C 14/022; C23C 14/46; C23C 14/505; F05D 2220/40; F05D 2230/313; F05D 2230/90; F05D 2240/20; F05D 2300/175; F05D 2300/2112
  See application file for complete search history.

(56) References Cited

U.S. PATENT DOCUMENTS

| | | |
|---|---|---|
| 2005/0035086 A1 | 2/2005 | Chen et al. |
| 2008/0272004 A1* | 11/2008 | Roth-Fagaraseanu ............... C23C 10/24 205/118 |
| 2015/0159254 A1* | 6/2015 | Reid .................... C23C 14/044 428/137 |
| 2017/0074103 A1* | 3/2017 | House ................... F04D 29/056 |
| 2018/0374688 A1* | 12/2018 | Chistyakov ......... C23C 14/0605 |

FOREIGN PATENT DOCUMENTS

| | | | |
|---|---|---|---|
| EP | 0937786 | B1 | 4/2008 |
| EP | 3227474 | B1 | 11/2019 |
| IN | 202041040353 | * | 9/2020 |
| WO | 2016086914 | A2 | 6/2016 |

* cited by examiner

TURBOCHARGER TURBINE WHEELS HAVING AN ALPHA-ALUMINA COATING AND METHODS FOR MANUFACTURING THE SAME

TECHNICAL FIELD

The present disclosure generally relates to turbocharger components and methods for manufacturing turbocharger components. More particularly, the present disclosure relates to turbocharger turbine wheels having an alpha-alumina coating and methods for manufacturing the same using physical vapor deposition processes.

BACKGROUND

Turbochargers for gasoline and diesel internal combustion engines are devices known in the art that are used for pressurizing or boosting the intake air stream, routed to a combustion chamber of the engine, by using the heat and volumetric flow of exhaust gas exiting the engine. Specifically, the exhaust gas exiting the engine is routed into a turbine housing of a turbocharger in a manner that causes an exhaust gas-driven turbine wheel to spin within the housing. The exhaust gas-driven turbine wheel is mounted onto one end of a shaft that is common to a radial air compressor mounted onto an opposite end of the shaft and housed in a compressor housing. Thus, rotary action of the turbine wheel also causes the air compressor to spin within a compressor housing of the turbocharger that is separate from the turbine housing. The spinning action of the air compressor causes intake air to enter the compressor housing and be pressurized or boosted a desired amount before it is mixed with fuel and combusted within the engine combustion chamber.

During operation, the exhaust gas-driven turbine wheel may be subjected to continuous impingement from exhaust gas temperatures in excess of 1000° C. Due to exposure to such these temperatures, the life of a turbocharger may be affected by such factors as thermal cracking, thermal oxidation, fatigue, and/or creep. As such, turbocharger turbine wheels are often made of materials that are able to withstand high temperatures. Common turbine wheel materials include nickel-based superalloys and titanium-aluminum (TiAl) alloys. These alloys, however, are still limited to operation at temperatures of up to about 1020° C. When subjected to temperatures beyond 1020° C., these materials are observed to fail due to a combination of oxidation and creep. Oxidation is a time dependent process, wherein ambient oxygen is attracted and diffused through the turbine wheel material. The diffusion process is directly proportional to the temperature on the metal surface, i.e., the higher the temperature, the faster the diffusion/reaction. The failure of such materials to withstand these high temperatures may result in material degradation, leading to loss of material, especially at the leading edges of the turbine wheel blades. Material degradation leads to a significant drop in turbine efficiency. While some specialty alloy materials exist, which can withstand temperatures above 1020° C., the use of these materials to manufacture the turbine wheel is impractical due to considerably higher costs.

Accordingly, it would be desirable to provide turbocharger turbine wheels that are able to withstand continuous exposure to exhaust gas temperatures in excess of 1020° C., without suffering from material degradation such as thermal cracking, thermal oxidation, fatigue, and/or creep. Furthermore, it would be desirable to provide such turbocharger turbine wheels that are able to be manufactured primarily from conventional nickel-based superalloys or titanium-aluminum alloys, thereby avoiding the use of high-cost specialty alloys. Furthermore, other desirable features and characteristics of the inventive subject matter will become apparent from the subsequent detailed description of the inventive subject matter and the appended claims, taken in conjunction with the accompanying drawings and this background of the inventive subject matter.

BRIEF SUMMARY

Turbocharger turbine wheels having an alpha-alumina coating and methods for manufacturing the same using physical vapor deposition processes are disclosed herein.

In an exemplary embodiment, an alpha-alumina coated turbocharger turbine wheel includes a hub portion, a plurality of blades disposed about the hub portion, each blade of the plurality of blades having a leading edge and a trailing edge, a centerline passing axially through the hub portion, and a back-side wall defined radially between the leading edge of each blade of the plurality of blades and the centerline. The turbocharger turbine wheel is made of a metal alloy and a surface coating layer of alpha-alumina. In some embodiments, the surface coating layer of alpha-alumina is disposed only on the hub portion, the plurality of blades, and a radially-outer portion of the back-side wall. The radially-outer portion is defined between a radial distance from the centerline and the leading edge of each blade of the plurality of blades. In other embodiments, the surface coating layer of alpha-alumina is disposed on the hub portion, the plurality of blades, and an entirety of the back-side wall.

In another exemplary embodiment, a method for manufacturing an alpha-alumina coated turbocharger turbine wheel includes the step of manufacturing or obtaining an un-coated turbocharger turbine wheel. The un-coated turbocharger turbine wheel includes a hub portion, a plurality of blades disposed about the hub portion, each blade of the plurality of blades having a leading edge and a trailing edge, a centerline passing axially through the hub portion, and a back-side wall defined radially between the leading edge of each blade of the plurality of blades and the centerline. The un-coated turbocharger turbine wheel is made of a metal alloy. The method further includes an optional step of masking a portion of the back-side wall of the un-coated turbocharger turbine wheel using a physical vapor deposition-compatible masking material. The portion of the back-side wall is annular and is defined as an area extending radially-outward form the centerline to a radial distance that is radially-inward from the leading edge of each blade of the plurality of blades. Still further, the method includes the step of subjecting the optionally masked, un-coated turbocharger turbine wheel to an alpha-alumina physical vapor deposition process, thereby coating a layer of alpha-alumina on non-masked portions of the optionally masked, un-coated turbocharger turbine wheel.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The inventive subject matter will hereinafter be described in conjunction with the following drawing figures, wherein like numerals denote like elements, and wherein.

DETAILED DESCRIPTION

Figure 1:
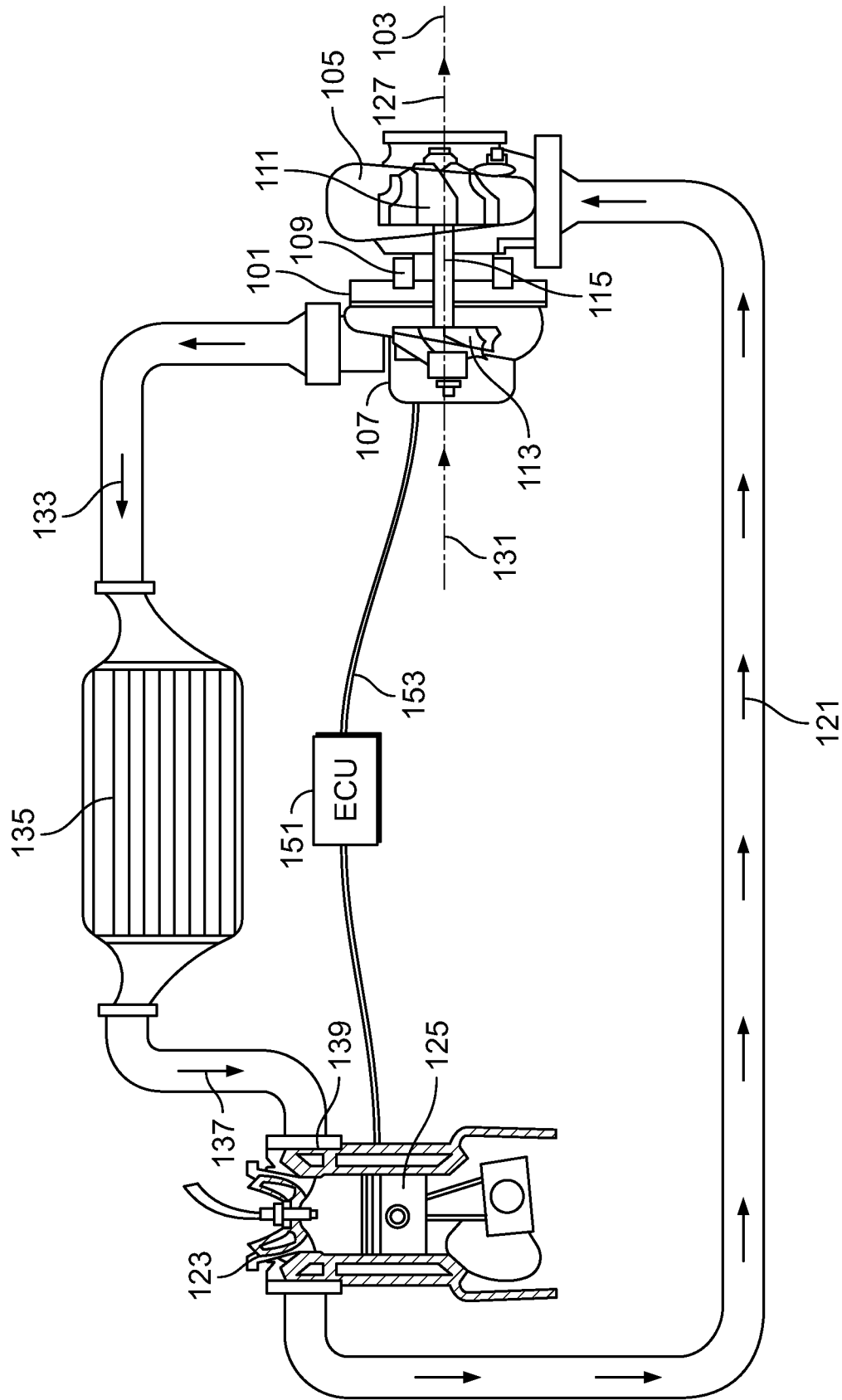
FIG. 1 is a system view of an exemplary internal combustion engine including a turbocharger in accordance with some embodiments of the present disclosure.

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Unless specifically stated or obvious from context, as used herein, the term "about" is understood as within a range of normal tolerance in the art, for example within 2 standard deviations of the mean. "About" can be understood as within 10%, 5%, 1%, 0.5%, 0.1%, 0.05%, or 0.01% of the stated value. "About" can alternatively be understood as implying the exact value stated. Unless otherwise clear from the context, all numerical values provided herein are modified by the term "about."

The present disclosure is generally directed to turbocharger turbine wheels having an alpha-alumina coating and methods for manufacturing the same using physical vapor deposition processes. The alpha-alumina coating is provided onto an entirety of the turbine wheel, or alternatively, onto portions of the turbine wheel that are directly exposed to the hot exhaust gases, including the hub and the blades, and may be provided at a thickness of about 10 microns. The alpha-alumina coating provides an effective barrier layer on the turbine wheel substrate material. High purity alpha-alumina has minimal impurity elements, which if present would contribute to microstructural defects. These defects would in turn act as a medium for oxygen diffusion at high temperatures. As such, providing a defect free, thin alpha-alumina coating will serve to reduce/eliminate oxygen diffusion, any consequent damage to the turbine wheel.

The turbine wheels may be coated in a physical vapor deposition process using a planetary motion arrangement. The turbine wheels may be optionally masked in areas not exposed to hot gases, namely the back-side wall, if it is desired to avoid coating on the datum surface and weld locations on the back-side wall region. This optional masking may be provided by gluing temperature-resistant polymeric and/or metallic materials to the back-side wall region. Furthermore, prior to physical vapor deposition of the alpha-alumina coating layer, the turbine wheels may be etched using a reactive ion treatment inside the physical vapor deposition chamber to achieve a more uniform alpha-alumina coating layer surface. As the alpha-alumina coating is deposited in the range of about 10 microns only, the need for any post-coating machining operations may be substantially reduced or eliminated. This thin coating will also minimize the need for extensive rotational balancing operations. Furthermore, because physical vapor deposition may be accomplished at temperatures below about 500° C., there will be no risk of wheel/blade thermal distortion due to the coating operation.

With reference now to FIG. 1, illustrated is a turbocharger 101 in accordance with the present disclosure having a radial turbine and that includes a turbocharger housing and a rotor configured to rotate within the turbocharger housing along an axis of rotor rotation 103 on thrust bearings and two sets of journal bearings (one for each respective rotor wheel), or alternatively, other similarly supportive bearings. The turbocharger housing includes a turbine housing 105, a compressor housing 107, and a bearing housing 109 (i.e., a center housing that contains the bearings) that connects the turbine housing 105 to the compressor housing 107. The rotor includes a turbine wheel 111 located substantially within the turbine housing 105, a compressor wheel 113 located substantially within the compressor housing 107, and a shaft 115 extending along the axis of rotor rotation 103, through the bearing housing 109, to connect the turbine wheel 111 to the compressor wheel 113.

The turbine housing 105 and turbine wheel 111 form a turbine configured to circumferentially receive a high-pressure and high-temperature exhaust gas stream 121 from an engine, e.g., from an exhaust manifold 123 of an internal combustion engine 125. The turbine wheel 111 (and thus the rotor) is driven in rotation around the axis of rotor rotation 103 by the high-pressure and high-temperature exhaust gas stream 121, which becomes a lower-pressure and lower-temperature exhaust gas stream 127 and is axially released into an exhaust system (not shown).

The compressor housing 107 and compressor wheel 113 form a compressor stage. The compressor wheel 113, being driven in rotation by the exhaust-gas driven turbine wheel 111, is configured to compress axially received input air (e.g., ambient air 131, or already-pressurized air from a previous-stage in a multi-stage compressor) into a pressurized air stream 133 that is ejected circumferentially from the compressor. Due to the compression process, the pressurized air stream is characterized by an increased temperature over that of the input air.

Optionally, the pressurized air stream may be channeled through a convectively cooled charge air cooler 135 configured to dissipate heat from the pressurized air stream 133, increasing its density. The resulting cooled and pressurized output air stream 137 is channeled into an intake manifold 139 on the internal combustion engine, or alternatively, into a subsequent-stage, in-series compressor. The operation of the system is controlled by an engine control unit (ECU) 151 that connects to the remainder of the system via communication connections 153.

Figure 2A:
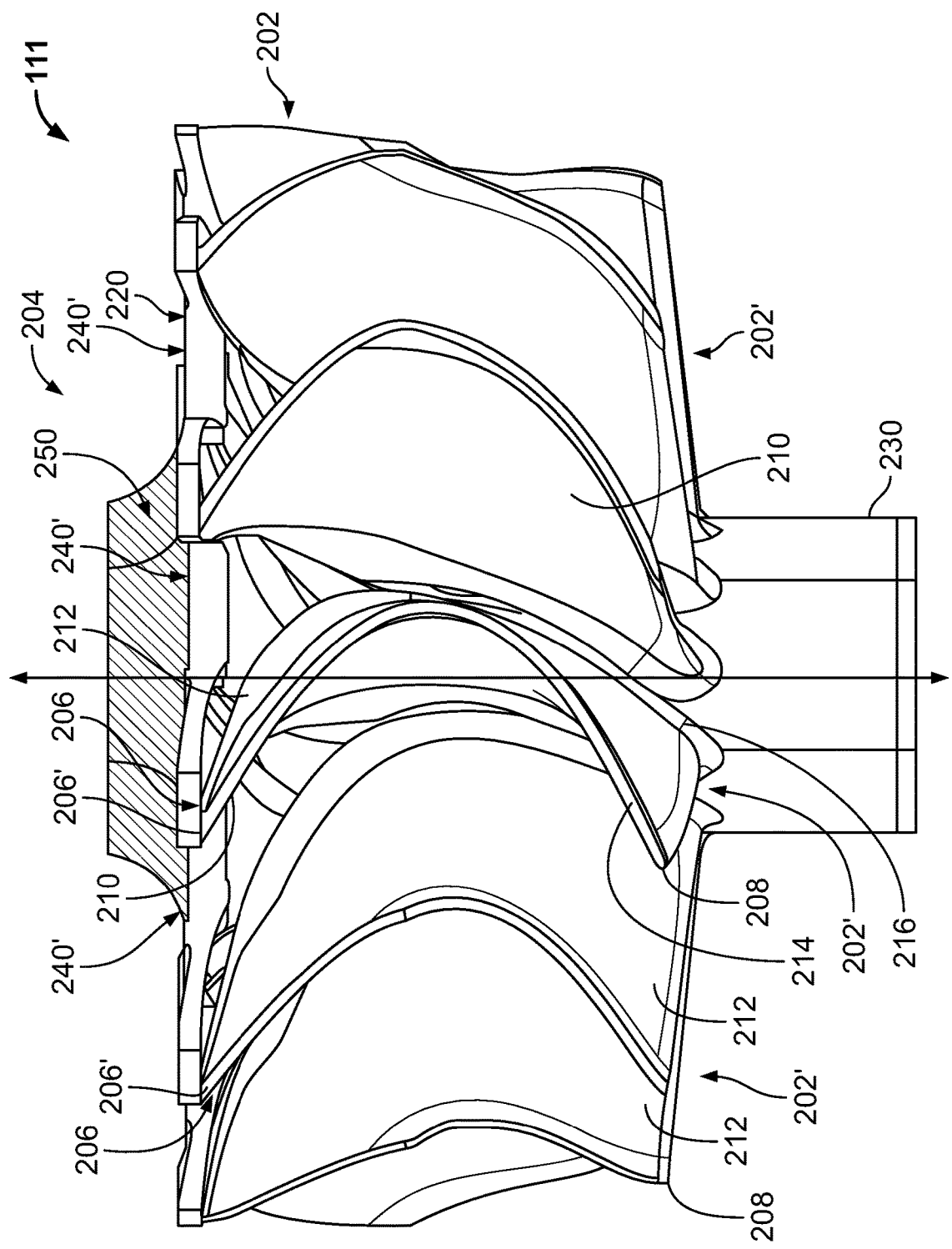
FIG. 2A is a top view of the turbine wheel shown in the turbocharger of FIG. 1, in an embodiment where masking is employed.
Figure 2B:
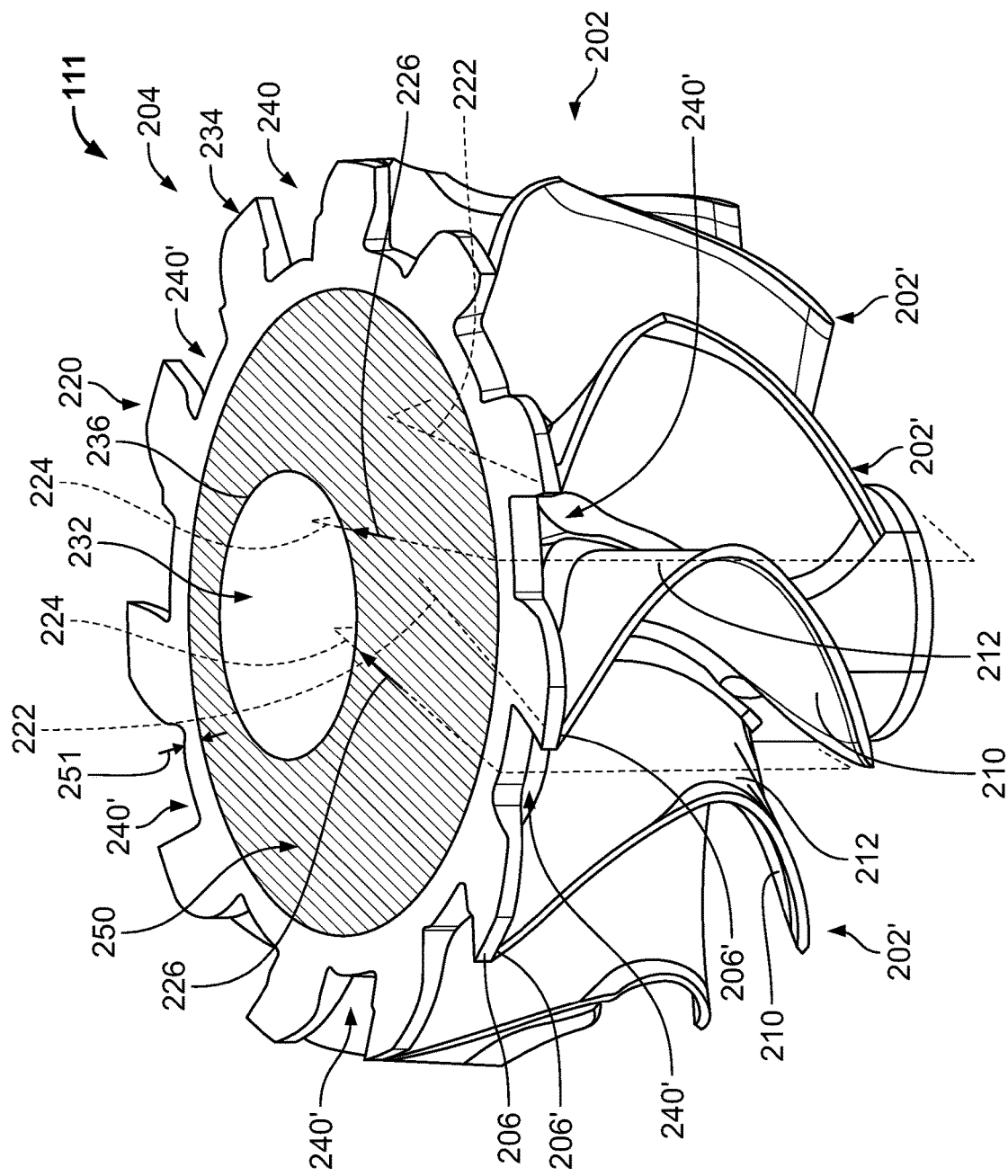
FIG. 2B is a perspective view of the turbine wheel shown in FIGS. 1 and 2A.
Figure 2C:
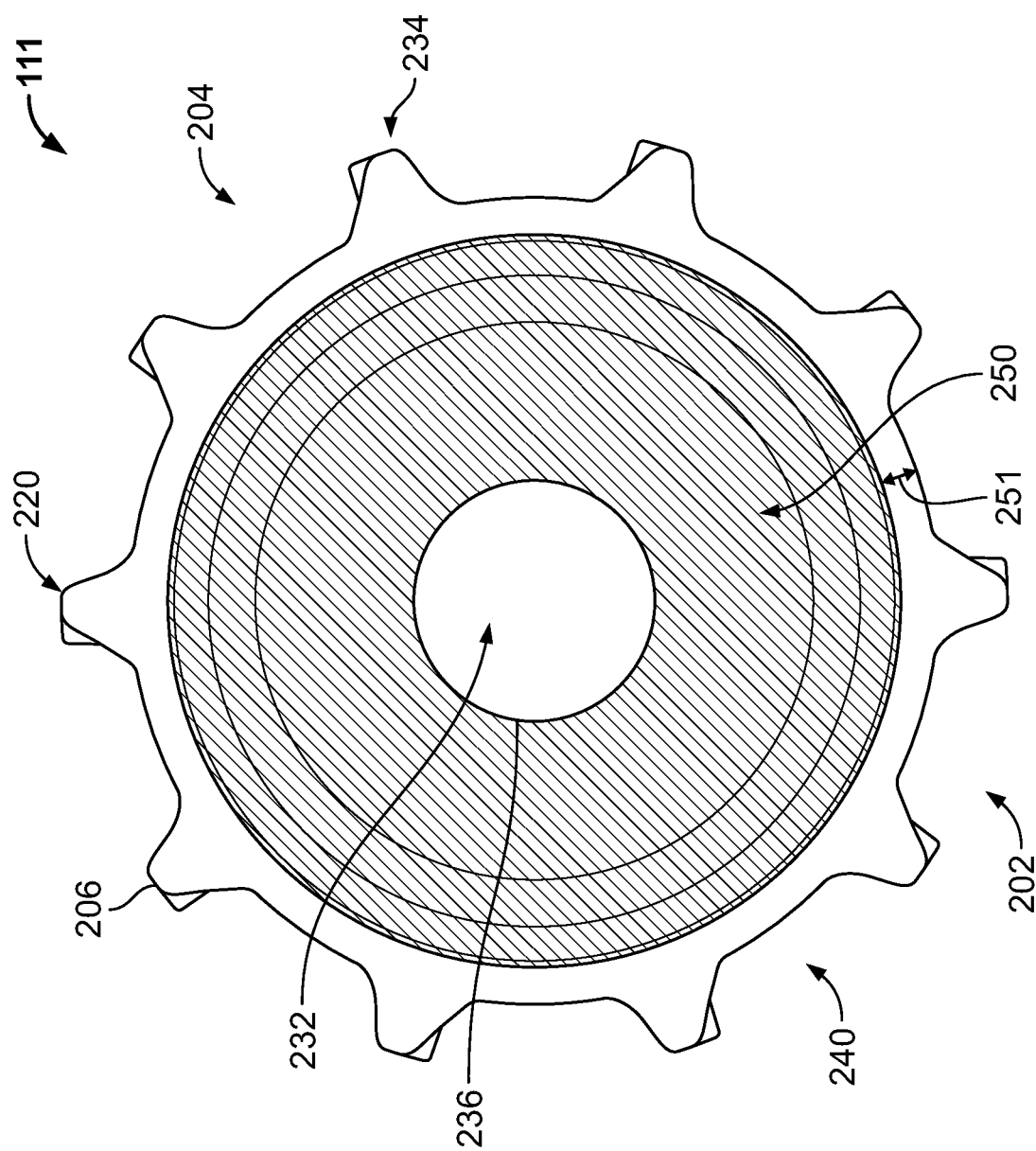
FIG. 2C is a back view of the turbine wheel shown in FIGS. 1, 2A, and 2B.

FIGS. 2A, 2B, and 2C are illustrative of an embodiment that employs the aforementioned optional masking step, in particular illustrating the turbine wheel 111 of the turbocharger 101. In each of these Figures, the shaded areas 250 are indicative of areas that will be masked during the subsequent physical vapor deposition process, and thus not receive the alpha-alumina coating layer, whereas the rest of the surfaces of the turbine wheel 111 (i.e., not shaded) will be coated with the alpha-alumina layer. The turbine wheel 111 includes a plurality of blades 202 and a wheel hub 204. The turbine wheel 111 is composed of a metal or metal alloy, non-limiting examples of which are a nickel-based superalloy (MAR-M-247 being exemplary) or a titanium-aluminum alloy, and may be cast, forged, machined, selective metal sintered, etc. The plurality of blades 202 may be integrally formed with the wheel hub 204, or may be coupled to the wheel hub 204 through a suitable processing step, such as hot isostatic pressing, etc. The wheel hub 204 of the turbine wheel 111 has a predetermined or predefined diameter and a predefined number of blades 202 based on the operating specifications and requirements of the turbocharger 111 for use with the internal combustion engine 125.

The plurality of blades 202 are spaced apart about a perimeter or circumference of the wheel hub 204. Each blade 202' of the plurality of blades 202 includes a leading edge 206, a trailing edge 208, a pressure side 210, a suction side 212, a tip 214 and a root 216. The leading edge 206 is in fluid communication with the exhaust gas and corresponds to the inducer of the turbine wheel 111. The leading edge 206 has a hub end 206' that is adjacent to a portion or back-side wall 220 of the wheel hub 204. In this example, the hub end 206' terminates at the back-side wall 220 of the wheel hub 204. The trailing edge 208 is substantially opposite the leading edge 206 and corresponds to the exducer of the turbine wheel 111. The exhaust gas flows from the leading edge 206 to the trailing edge 208.

The pressure side 210 is defined along a first concave outer wall of the respective blade 202'. The suction side 212 is opposite the pressure side 210 and is defined along a second convex outer wall of the respective blade 202'. The outer walls cooperate to define an airfoil shape for the respective blade 202'. The tip 214 extends from the leading edge 206 to the trailing edge 208. The root 216 is substantially opposite the tip 214.

Each of the blades 202' is coupled to or attached to the back-side wall 220 of the wheel hub 204 along a blade hub camber line 222. The blade hub camber line 222 is also defined by a plurality of mid-points along a surface of the respective blade 202' at the intersection of the root 216 of the blade 202' with the wheel hub 204. A blade hub interface is defined at the intersection of the root 216 with the wheel hub 204. Each of the plurality of mid-points are defined at a location that is in the middle between the pressure side 210 and the suction side 212 of the respective blade 202' along the intersection of the blade 202' with the wheel hub 204. It should be noted that for ease of illustration, the blade hub camber line 222 is shown for only two of the blades 202' in FIG. 2B, but each of the blades 202' includes the blade hub camber line 222.

In addition, each blade 202' of the plurality of blades 202 defines a mid-plane 224. The mid-plane 224 is defined in the middle between adjacent pressure sides 210 and suction sides 212 of the plurality of blades 202. A mid-line 226 is defined by the mid-plane 224. The mid-line 226 between each adjacent pair of blades 202' is constructed by revolving the blade hub camber line 222 by an angle equal to half the spaced angle between every two blades 202'. It should be noted that for ease of illustration, the mid-plane 224 and the mid-line 226 is shown for only two of the blades 202' in FIG. 2B, but each pair of blades 202' of the plurality of blades 202 includes the mid-plane 224 and the mid-line 226.

As discussed, each blade 202' of the plurality of blades 202 is coupled to the wheel hub 204 such that the pressure side 210 of one of the blades 202' is facing a suction side 212 of an adjacent one of the blades 202'. The wheel hub 204 includes a hub 230 and the back-side wall 220. A flow channel for the exhaust gas through the turbine wheel 111 may be bounded by two adjacent blades 202', a portion of the hub 230 and a section of the back-side wall 220. The hub 230 defines a centerline 232 that extends along a central axis. The central axis is substantially coaxial with the axis of rotation 103 (FIG. 1). The shaft 115 is received within the centerline 232 to couple the turbine wheel 111 to the shaft 115 (FIG. 1). A portion of the hub 230 is radially extended in a plane perpendicular to the central axis of the centerline 232 to define the back-side wall 220. It should be noted that while in this example, the back-side wall 220 is defined by the portion of the hub 230 radially extended in the plane perpendicular to the central axis of the centerline 232, the present disclosure is not so limited. In this regard, a portion of the hub 230 may be radially extended along a plane that is oblique to the central axis of the centerline 232 such that the back-side wall 220 is defined at an angle or an incline relative to the central axis of the centerline 232.

The back-side wall 220 is annular and has an outer perimeter or outer circumference 234 and an inner perimeter or inner circumference 236. The wall 220 is defined by a plurality of radii, each associated with one scallop 240' of a plurality of scallops 240 defined through the back-side wall 220 of the wheel hub 204 at the outer circumference 234. As can be appreciated, each of the plurality of radii and each of the plurality of scallops 240 are the same, and thus, the plurality of radii of only one scallop 240' will be described in detail herein. It should be understood, however, that while the plurality of scallops 240 are described and illustrated herein as being the same, one or more scallops of the plurality of scallops 240 may have a plurality of radii that are different than a reminder of the plurality of scallops 240. Moreover, while the back-side wall 220 of the wheel hub 204 is illustrated and described herein as having the outer circumference 234 that coincides with the leading edge 206 of each of the blades 202', it will be understood that in various embodiments the outer circumference 234 of the back-side wall 220 need not coincide with the leading edge 206 of each of the blades 202', rather, the back-side wall 220 may be offset from the leading edge 206 of each of the blades 202', for example.

Portions of the back-side wall 220 also define the area to be masked (not receive the alpha-alumina coating during the physical vapor deposition process), shown as shaded area 250. Specifically, the shaded area 250 may be annular, and may extend from the inner circumference 236 radially outward to a defined distance 251 radially-inward from the scallops 240. Distance 251 may be a percentage of the radii associated with the scallops 240, such as between about 5% and about 30%, or about 10% and about 25%, in various embodiments, as illustrated. As initially noted above, the masking material provided in area 250 may include any conventional glued-on temperature-resistant polymeric and/or metallic materials, as known in the art for physical vapor deposition processes. Greater detail regarding the alpha-alumina coating layer provided on the non-masked surfaces of the turbine wheel 111, including the hub 230, the blades 202, and the back-side wall 220 radially-outward from shaded area 250, is now provided below.

Figure 2D:
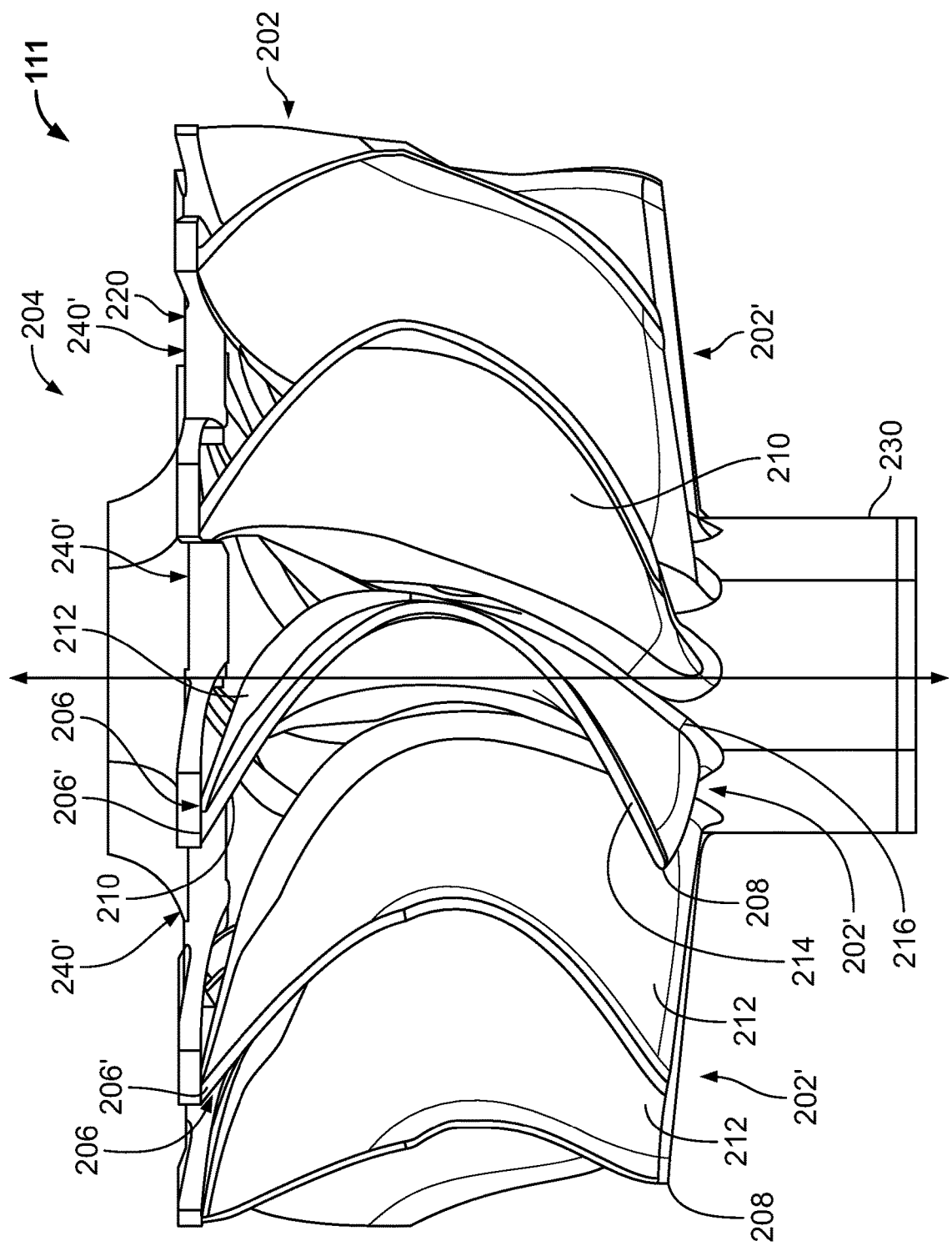
FIGS. 2D, 2E, and 2F views corresponding with FIGS. 2A, 2B, and 2C, in an alternative embodiment where masking is not employed.
Figure 2E:
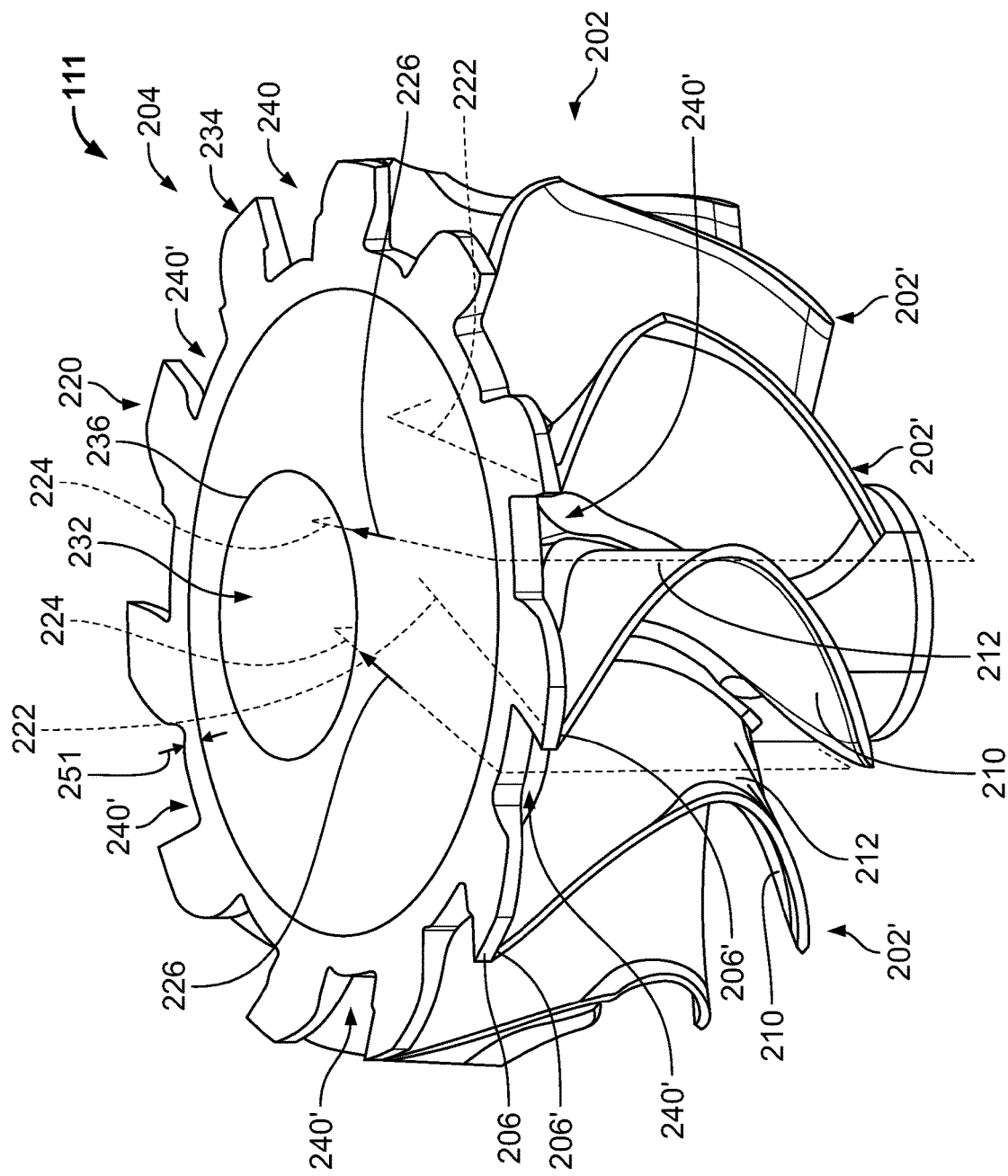
Figure 2F:
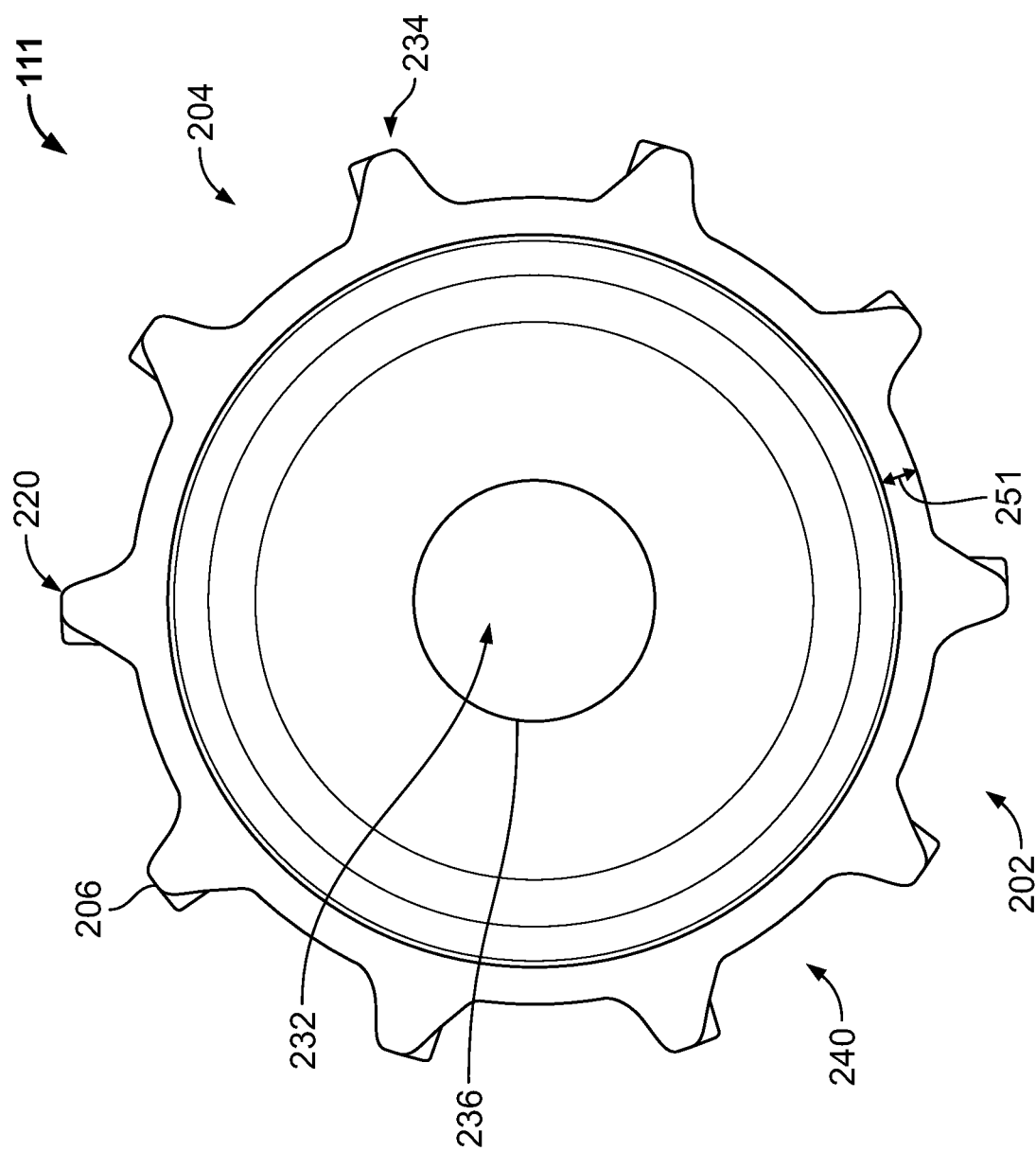

FIGS. 2D, 2E, and 2F are illustrative of an embodiment that does not employ the aforementioned optional masking step. As shown in each of these Figures, the shaded area 250 indicating masking is not present at all. In all other respects, FIGS. 2D, 2E, and 2F are the same as FIGS. 2A, 2B, and 2C, respectively, and thus the configuration details of the turbine wheel 111 shown therein will not be repeated here, for brevity.

Aluminum oxide, commonly referred to as alumina ($Al_2O_3$), has various beneficial material properties as applicable to turbocharger operations, such as high thermal insulation, electrical resistivity, hardness, good resistance to wear and corrosion, resistance to oxygen diffusion, and physical stability at high temperatures. The alpha phase of alumina, also known as corundum, is the only thermodynamically stable alumina phase, and possesses very good mechanical properties, which are preserved at the high operating temperatures of turbochargers, such as in excess of 1000° C. The crystal structure of alpha-alumina may be described as an approximately hexagonal close packed (hcp) oxygen sublattice, with aluminum atoms filling two thirds of the octahedrally coordinated interstitial positions. The [0001] direction of the hexagonal unit cell coincides with the [111] direction of the primitive rhombohedral cell.

The formation of thin layers of crystalline alpha-alumina may be accomplished by physical vapor deposition in a temperature range of about 400° C. to about 500° C. In physical vapor deposition techniques, material (alumina) is vaporized (in vacuum) from a solid source and transported to the substrate (turbine wheel 111), where it condenses to form a thin film. Hence, physical vapor deposition processes may be used at significantly lower substrate temperatures compared to alternative deposition techniques, such as chemical vapor deposition, making it possible to perform depositions on heat sensitive substrates, such as turbine wheels where exposure to the higher temperatures of chemical vapor deposition may cause distortion of the tightly-controlled design parameters, particularly of the blades 202.

A range of different types of physical vapor deposition methods exist. The most straight-forward ones rely on evaporation (or sublimation) of the source material. In this case, the material to be deposited is simply supplied with enough thermal energy in order to form a vapor, which then condenses on the substrate. However, with increasing demands on the quality of the coatings, such as the ability to form primarily the alpha phase of alumina, more flexible and efficient plasma-based physical vapor deposition methods have been developed and are suitable for use in accordance with the present disclosure. Among these, arc evaporation and sputtering are the most common ones. In arc evaporation, a high-current, low-voltage discharge in the form of an arc spot is formed on the source. However, the deposition rate is usually high, and the technique is commonly used to deposit thicker coatings in industrial applications. Given the need for a thin coating of alpha-alumina on the turbine wheels of the present disclosure, it is presently contemplated that arc evaporation may not be suitable.

Sputter deposition, on the other hand, relies on the ejection of the source material through charged particle bombardment (e.g., electrons or ions), utilizing a high-voltage, low-current plasma discharge. The basic principle in sputtering relies on ejection (sputtering) of atoms from a source (usually called target) by bombardment of gaseous ions from a plasma (sometimes referred to as a glow discharge) or an electron beam. The ejected atoms are then transported to the substrate (turbine wheel), where they condense to form a film. The plasma is created by letting in a sputtering gas (usually a noble gas such as argon) in an evacuated vacuum chamber and applying a voltage between the target (cathode) and the chamber walls (anode). The applied voltage causes an avalanche effect in the gas, where the few electrons initially present in the gas are accelerated away from the cathode, eventually hitting gas atoms, ionizing them if the energy is high enough, and thereby creating more and more ions and electrons. If the conditions are suitable, a steady state will be reached where a partially ionized gas, a plasma, is sustained in the chamber.

Figure 3:
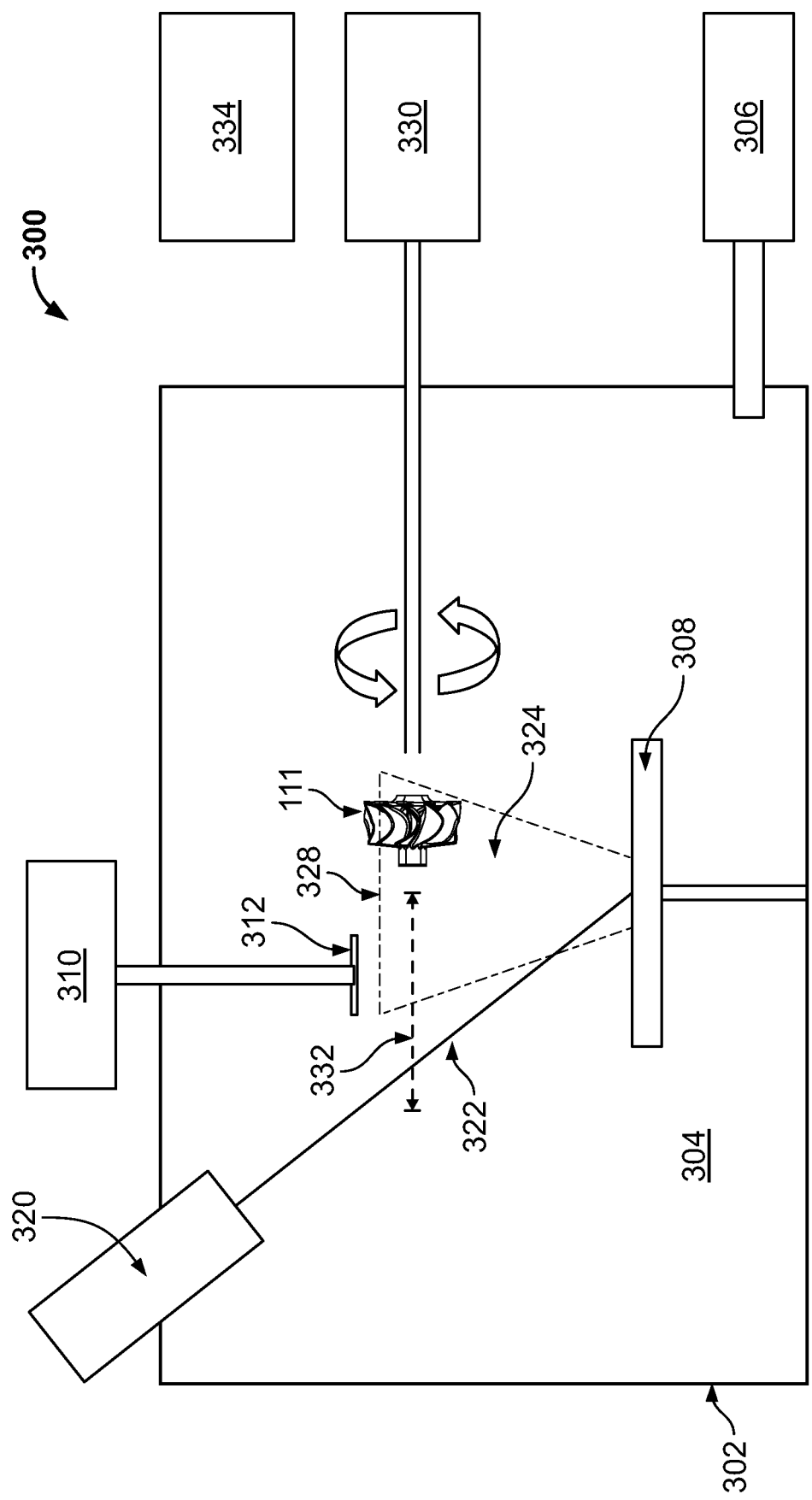
FIG. 3 is a system view of a physical vapor deposition apparatus configured to deposit an alpha-alumina layer onto a turbine wheel, such as the turbine wheel shown in FIGS. 1 and 2A-2F, in accordance with some embodiments of the present disclosure.

With reference now to FIG. 3, shown is an exemplary physical vapor deposition system 300 for depositing the alpha-alumina coating onto the above-described non-masked portions of the turbocharger turbine wheel 111. The system 300 includes a vessel or chamber 302 having an interior 304. A vacuum pump 306 is coupled to the vessel to evacuate the interior. An aluminum and/or alumina target 308 is located in the interior. An oxygen source 310 may be positioned to introduce oxygen to the interior 304 via a manifold 312. A charged particle source (ion, electron) 320 is positioned to direct an energy beam 322 to the target to vaporize a surface of the target to create a vapor cloud 324. A fixture or holder 336 is positioned in the chamber to hold a component (e.g., the turbine wheel 111) exposed to the vapor cloud 324. The vapor cloud condenses on the component to form the alpha-alumina coating.

The turbocharger turbine wheel 111 is held in a planetary arrangement within the chamber 302, wherein a motor 330 is coupled to the holder 336 to rotate the holder 336 and turbine wheel 111 about an axis 332. A controller 334 (e.g., a microcontroller, microcomputer, or the like) may be coupled to the motor 320, the charged particle source 320, the vacuum pump 306, oxygen source 310 and/or any other appropriate components, sensors, input devices, and the like to control aspects of system operation. The exemplary controller 334 may be programmed (e.g., via one or both of software and hardware) to vary a rotational speed of the holder 336 and turbine wheel 111 about the axis during deposition, if desired.

The alpha-alumina coating is built up over the course of a plurality of rotations, over a period of time. The rotational speed may be constant, or, in some embodiments, by varying the rotational speed using controller 334, the buildup at any given location on the turbine wheel 111 will be the result of passes at the different speeds. Each rotational pass builds up a small sublayer of the coating (e.g., having a sublayer thickness of about 0.1-1.0 microns, in some examples). The total thickness of the deposited alpha-alumina layer, after deposition is complete, may be from about 5 microns to about 20 microns, such as about 8 microns to about 15 microns. An exemplary embodiment employs an alpha-alumina layer of about 10 microns in thickness. The amount of time required to achieve the desired thickness will be dependent on the particular system 300 employed, its operational parameters, and the configuration of the turbine wheel 111, among other factors. The person having ordinary skill in the art is expected to have sufficient operational knowledge of physical vapor deposition systems to achieve the desired thickness.

In some embodiments, prior to the start of the deposition process as described above, the physical vapor deposition system 300 may further be configured to perform a reactive ion etching treatment of the turbine wheel 111. Reactive ion etching uses a combination of chemical and physical reactions to remove material from the substrate, namely the turbine wheel 111. Reactive ion etching is a highly anisotropic etching process that may be achieved through the application of energetic ion bombardment of the substrate, wherein the ions are provided by the charged particle source and directed at the turbine wheel 111. Reactive ion etching provides for a more uniform surface of the turbine wheel 111 (compared with its initially cast form), and better prepares the turbine wheel 111 for subsequently receiving the alpha-alumina layer (i.e., a more uniform layer of alpha-alumina will be formed). In this manner, the alpha-alumina layer may have a substantially-uniform thickness, meaning that the thickness varies across the entirety of the coated portions of the turbine wheel by less than about 20%, or less than about 10%, or less than about 5%, on an absolute basis. Additionally, once the physical vapor deposition process is completed, the coated turbine wheel 111 is removed from the system 300 (chamber 302), and the masking material, if present, is removed. Still further, if necessary, final machining and/or rotational balancing may be performed, although due to the thin layer of alpha-alumina deposited, such steps are expected to be minimized.

Figure 4:
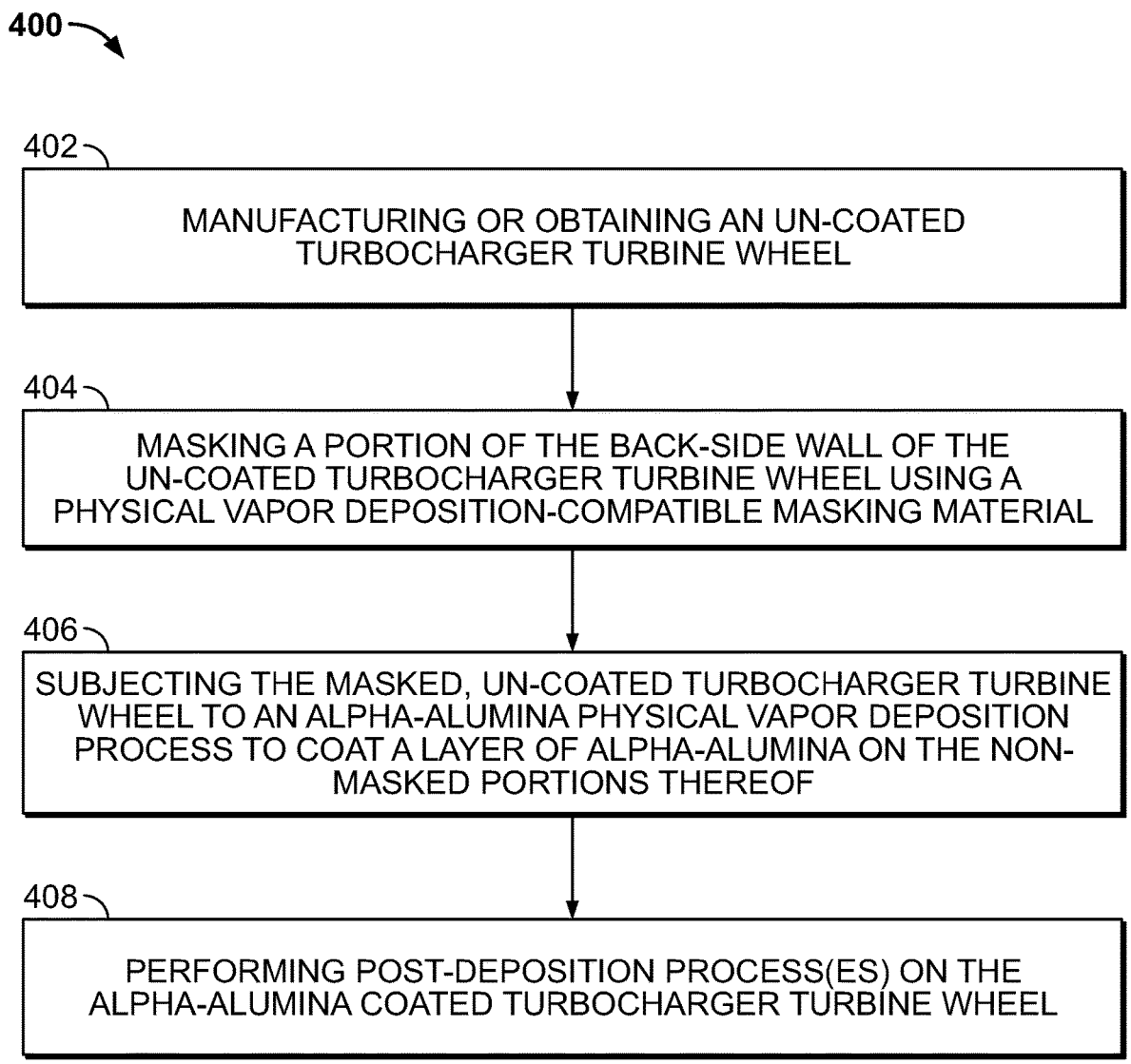
FIG. 4 is a flowchart illustrating a method for depositing a layer of alpha-alumina onto a turbine wheel, such as the turbine wheel shown in FIGS. 1 and 2A-2F, using a system such as that shown in FIG. 3, in accordance with some embodiments of the present disclosure.

In view of the foregoing, and turning now to FIG. 4, illustrated is a method 400 for manufacturing turbocharger turbine wheel having an alpha-alumina coating using physical vapor deposition processes. Method 400 begins with step 402, which includes manufacturing or obtaining an un-coated turbocharger turbine wheel, for example as described above in connection with FIGS. 2A-2F. The un-coated turbocharger turbine wheel manufactured or obtained in step 402 generally includes a hub portion, a plurality of blades disposed about the hub portion, each blade of the plurality of blades having a leading edge and a trailing edge, a centerline passing axially through the hub portion, and a back-side wall defined radially between the leading edge of each blade of the plurality of blades and the centerline. The un-coated turbocharger turbine wheel is made of a metal alloy, such as a nickel-based superalloy or a titanium-aluminum alloy, for example.

Method 400 continues with an optional step 404 of masking a portion of the back-side wall of the un-coated turbocharger turbine wheel using a physical vapor deposition-compatible masking material, such as temperature-resistant polymeric and/or metallic materials, which may be glued-on to the portion of the back-side wall. The portion of the back-side wall is annular and may be defined as the area extending radially-outward form the centerline to a radial distance that is radially-inward from the leading edge of each blade of the plurality of blades, as illustrated best and described above in connection with FIGS. 2B and 2C.

Method 400 continues with a step 406 of subjecting the optionally masked, un-coated turbocharger turbine wheel to an alpha-alumina physical vapor deposition process to coat a layer of alpha-alumina on the non-masked portions thereof. The physical vapor deposition process may be performed in a system as described above in connection with FIG. 3 and may include electron/ion sputtering with the turbocharger turbine wheel mounted in a planetary arrangement. The physical vapor deposition process is performed at a temperature of about 500° C. or below, such as about 400° C. to about 500° C., so as not to thermally distort the turbocharger turbine wheel, particularly the plurality of blades. Physical vapor deposition may be performed for sufficient time to create a substantially-uniform alpha-alumina layer on the non-masked surfaces of the turbocharger turbine wheel, which may have a thickness selected from a value with in the range of about 5 microns to about 20 microns, or about 8 microns to about 15 microns, or about 10 microns. The amount of time required will be dependent on the particular system employed, its operational parameters, and the configuration of the turbine wheel, among other factors. The person having ordinary skill in the art is expected to have sufficient operational knowledge of physical vapor deposition systems to achieve the desired thickness. To aid in achieving the substantially-uniform thickness, a reactive ion etching process may be performed on the turbocharger turbine wheel prior to beginning the physical vapor deposition of the alpha-alumina layer.

Method 400 concludes with a step 408 of performing one or more post-deposition processes on the alpha-alumina coated turbocharger turbine wheel. One such post-deposition process that will often be performed is the removal of the masking material, if present, which is achieved in the conventional manner Other post-deposition processes may include machining to final tolerances and/or rotationally balancing to avoid vibrational forces during the high rotational speed that turbocharger turbine wheels are subjected to. It should be noted that due to the relatively thin layer of alpha-alumina deposited, the need for steps such steps as machining and rotational balancing may be substantially reduced or eliminated entirely.

As a result of performing the method 400, what has been manufactured, in the embodiment that employs the optional masking, is a turbocharger turbine wheel that includes a hub portion, a plurality of blades disposed about the hub portion, each blade of the plurality of blades having a leading edge and a trailing edge, a centerline passing axially through the hub portion, and a back-side wall defined radially between the leading edge of each blade of the plurality of blades and the centerline. The turbocharger turbine wheel is made of a metal alloy and a surface coating layer of alpha-alumina. The surface coating layer of alpha-alumina is disposed only on the hub portion, the plurality of blades, and a radially-outer portion of the back-side wall. The radially-outer portion is defined between a radial distance from the centerline and the leading edge of each blade of the plurality of blades. What has been manufactured in the embodiment that does not employ masking is similar as described above, except the surface coating layer of alpha-alumina is disposed on the hub portion, the plurality of blades, and an entirety of the back-side wall.

Accordingly, the present disclosure has provided turbocharger turbine wheels having an alpha-alumina coating and methods for manufacturing the same using physical vapor deposition processes. The alpha-alumina coating is provided onto an entirety of the turbine wheel, or alternatively, onto portions of the turbine wheel that are directly exposed to the hot exhaust gases, including the hub and the blades, and may be provided at a thickness of about 10 microns. The alpha-alumina coating provides an effective barrier layer on the turbine wheel substrate material. As such, providing a defect free, thin alpha-alumina coating serves to reduce/eliminate oxygen diffusion, any consequent damage to the turbine wheel.

While at least one exemplary embodiment has been presented in the foregoing detailed description of the inventive subject matter, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing an exemplary embodiment of the inventive subject matter. It being understood that various changes may be made in the function and arrangement of elements described in an exemplary embodiment without departing from the scope of the inventive subject matter as set forth in the appended claims.

What is claimed is:

1. An alpha-alumina coated turbocharger turbine wheel comprising:
    a hub portion;
    a plurality of blades disposed about the hub portion, each blade of the plurality of blades having a leading edge and a trailing edge;
    a centerline passing axially through the hub portion; and
    a back-side wall defined radially between the leading edge of each blade of the plurality of blades and the centerline,
    wherein the turbocharger turbine wheel is comprised of a metal alloy and a surface coating layer of alpha-alumina, the surface coating layer of alpha-alumina being disposed
    only on the hub portion, the plurality of blades, and a radially-outer portion of the back-side wall, the radially-outer portion being defined between a radial distance from the centerline and the leading edge of each blade of the plurality of blades.

2. The turbocharger turbine wheel of claim 1, wherein the metal alloy is a nickel-based superalloy.

3. The turbocharger turbine wheel of claim 1, wherein the metal alloy is a titanium-aluminum alloy.

4. The turbocharger turbine wheel of claim 1, wherein a surface of the back-side wall from the centerline extending radially outward to the radial distance comprises the metal alloy.

5. The turbocharger turbine wheel of claim 1, wherein the surface coating layer of alpha-alumina has a substantially uniform thickness.

6. The turbocharger turbine wheel of claim 5, wherein the substantially uniform thickness is selected from a value within the range of about 5 microns to about 20 microns.

7. The turbocharger turbine wheel of claim 6, wherein the substantially uniform thickness is selected from a value within the range of about 8 microns to about 15 microns.

8. The turbocharger turbine wheel of claim 7, wherein the substantially uniform thickness is about 10 microns.

9. A method for manufacturing an alpha-alumina coated turbocharger turbine wheel, the method comprising:
    manufacturing or obtaining an un-coated turbocharger turbine wheel, the un-coated turbocharger turbine wheel comprising a hub portion, a plurality of blades disposed about the hub portion, each blade of the plurality of blades having a leading edge and a trailing edge, a centerline passing axially through the hub portion, and a back-side wall defined radially between the leading edge of each blade of the plurality of blades and the centerline, wherein the un-coated turbocharger turbine wheel is made of a metal alloy;
    masking a portion of the back-side wall of the un-coated turbocharger turbine wheel using a physical vapor deposition-compatible masking material, wherein the portion of the back-side wall is annular and is defined as an area extending radially-outward form the centerline to a radial distance that is radially-inward from the leading edge of each blade of the plurality of blades; and
    subjecting the masked, un-coated turbocharger turbine wheel to an alpha-alumina physical vapor deposition process, thereby coating a layer of alpha-alumina on non-masked portions of the masked, un-coated turbocharger turbine wheel.

10. The method of claim 9, wherein the physical vapor deposition-compatible masking material comprises a temperature-resistant polymeric and/or metallic material.

11. The method of claim 9, further comprising performing reactive ion etching on the masked, un-coated turbocharger turbine wheel prior to subjecting the masked, un-coated turbocharger turbine wheel to the alpha-alumina physical vapor deposition process.

12. The method of claim 9, wherein the alpha-alumina physical vapor deposition process is performed at a temperature of about 400° C. to about 500° C.

13. The method of claim 9, wherein the metal alloy comprises a nickel-based superalloy or a titanium-aluminum alloy.

14. The method of claim 9, further comprising performing one or more post-deposition processes on the alpha-alumina coated turbocharger turbine wheel.

15. The method of claim 14, wherein the one or more post-deposition processes comprises removing the physical vapor deposition-compatible masking material from the alpha-alumina coated turbocharger turbine wheel.

16. The method of claim 14, wherein the one or more post-deposition processes comprises machining the alpha-alumina coated turbocharger turbine wheel to final tolerances.

17. The method of claim 14, wherein the one or more post-deposition processes comprises rotationally balancing the alpha-alumina coated turbocharger turbine wheel.

18. The method of claim 9, wherein subjecting the masked, un-coated turbocharger turbine wheel to an alpha-alumina physical vapor deposition process is performed for a period of time sufficient to deposit a layer of alpha-alumina to a thickness from about 5 microns to about 20 microns.

19. The method of claim 18, wherein subjecting the masked, un-coated turbocharger turbine wheel to an alpha-alumina physical vapor deposition process is performed for a period of time sufficient to deposit a layer of alpha-alumina to a thickness from about 8 microns to about 15 microns.

20. The method of claim 19, wherein subjecting the masked, un-coated turbocharger turbine wheel to an alpha-alumina physical vapor deposition process is performed for a period of time sufficient to deposit a layer of alpha-alumina to a thickness of about 10 microns.

* * * * *